US012784831B2

(12) United States Patent
Hirano et al.

(10) Patent No.: US 12,784,831 B2
(45) Date of Patent: Nov. 3, 2026

(54) SEMICONDUCTOR MEMORY DEVICE

(71) Applicants: TOWER PARTNERS SEMICONDUCTOR CO., LTD., Uozu City (JP); TOWER SEMICONDUCTOR LTD., Migdal Haemek (IL)

(72) Inventors: Hiroshige Hirano, Nara (JP); Hiroaki Kuriyama, Toyama (JP); Atsushi Noma, Toyama (JP); Evgeny Pikhay, Migdal Haemek (IL); Yakov Roizin, Migdal Haemek (IL)

(73) Assignees: TOWER PARTNERS SEMICONDUCTOR CO., LTD., Uozu City (JP); TOWER SEMICONDUCTOR LTD., Migdal Haemek (IL)

( * ) Notice: Subject to any disclaimer, the term of this patent is extended or adjusted under 35 U.S.C. 154(b) by 174 days.

(21) Appl. No.: 19/006,014

(22) Filed: Dec. 30, 2024

(65) Prior Publication Data

US 2026/0120767 A1 Apr. 30, 2026

(30) Foreign Application Priority Data

Oct. 29, 2024 (JP) ................................ 2024-190130

(51) Int. Cl.

| | |
|---|---|
| ***G11C 11/34*** | (2006.01) |
| ***G11C 16/04*** | (2006.01) |
| ***H10B 41/35*** | (2023.01) |
| ***H10B 41/70*** | (2023.01) |

(52) U.S. Cl.
CPC ......... *G11C 16/0441* (2013.01); *H10B 41/35* (2023.02); *H10B 41/70* (2023.02)

(58) Field of Classification Search
CPC ..... G11C 16/0441; H10B 41/40; H10B 41/35
USPC ...................................................... 365/185.1
See application file for complete search history.

(56) References Cited

U.S. PATENT DOCUMENTS

| | | | | |
|---|---|---|---|---|
| 8,391,060 | B2 * | 3/2013 | Kato | G11C 16/0441 365/185.11 |
| 9,287,280 | B2 * | 3/2016 | Tsao | H10B 41/35 |
| 9,460,798 | B2 * | 10/2016 | La Rosa | G11C 16/0408 |
| 9,472,289 | B2 * | 10/2016 | Yamakoshi | G11C 16/0441 |
| 9,847,133 | B2 * | 12/2017 | Lai | G11C 16/0408 |
| 9,892,787 | B2 * | 2/2018 | Chen | G11C 11/412 |
| 9,972,632 | B2 * | 5/2018 | Wang | G11C 16/0433 |
| 10,312,248 | B2 * | 6/2019 | Tran | G11C 16/0408 |

(Continued)

FOREIGN PATENT DOCUMENTS

| | | | | |
|---|---|---|---|---|
| JP | 2023-089475 A | | 6/2023 | |
| JP | 7778205 B1 | * | 12/2025 | G11C 16/0433 |

*Primary Examiner* — Viet Q Nguyen
(74) *Attorney, Agent, or Firm* — Maschoff Brennan

(57) ABSTRACT

A semiconductor memory device includes a plurality of memory cells formed on a semiconductor substrate. Each of the memory cells includes a first floating gate transistor (TFG1), a second floating gate transistor (TFG2), a first erasing element, a second erasing element, and a memory cell selection transistor. A gate of TFG1 is electrically coupled to a gate of the first erasing element. A gate of TFG2 is electrically coupled to a gate of the second erasing element. A source of TFG1 is electrically coupled to a drain of the memory cell selection transistor. A source of TFG2 is electrically coupled to the drain of the memory cell selection transistor or a drain of TFG1.

12 Claims, 8 Drawing Sheets

(56) References Cited

U.S. PATENT DOCUMENTS

| | | | | |
|---|---|---|---|---|
| 10,879,252 | B2 * | 12/2020 | Xing | H10B 41/30 |
| 11,316,024 | B2 * | 4/2022 | Wang | G11C 16/0425 |
| 11,398,259 | B2 * | 7/2022 | Chen | G11C 11/1673 |
| 11,621,335 | B2 * | 4/2023 | Wang | G11C 16/0425<br>365/185.18 |
| 12,315,569 | B2 * | 5/2025 | Kuo | G11C 16/0441 |
| 2023/0200062 | A1 | 6/2023 | Hirano et al. | |

* cited by examiner

SEMICONDUCTOR MEMORY DEVICE

BACKGROUND

Semiconductor memory devices are used in various electronic devices. For example, nonvolatile memory (NVM) is widely used in portable devices or the like.

In general, NVMs are classified into multi-time programmable (MTP) memory that is rewritable and one-time programmable (OTP) memory that is writable only once. The MPT memory is readable multiple times and writable multiple times. An erasing operation is not necessary for OTP, while an erasing operation is necessary for MTP.

As one type of NVMs, single poly-NMV that can reduce additional fabrication steps has been proposed. In the single-poly NMV, a charge storage floating gate including a single layer of polysilicon is formed. The single-poly NMV can be manufactured in a regular manufacturing process for a complementary metal oxide semiconductor (CMOS), and therefore, can be applied as an embedded memory that is embedded in a microcontroller or the like. Note that Japanese Unexamined Patent Publication No. 2023-89475 is a document in this field.

SUMMARY

A nonvolatile memory having a configuration described above includes a transistor including a floating gate (FG) as a gate electrode. Depending on whether there are charges stored in the floating gate (FG), a current of the transistor differs. By utilizing this, the nonvolatile memory stores nonvolatile data.

In such a storage device, in a case where a gate oxide film is formed to have a reduced thickness in accordance with a request for reduction in size, in a case where the gate oxide film has a defect, or the like, charges stored in the floating gate leak in some cases. This is known as stress-induced leakage current (SILC) mode or the like. When this situation occurs, proper storage state cannot be held, thus resulting in defective bits, in some cases. This defect occurs at very low probability and temperature dependency of a holding time is small in many cases. Therefore, screening or the like is difficult, and furthermore, it is also difficult to relieve the defective bits by screening. Moreover, a number of defective bits tends to increase with the holding time. It can be predicted that, in a ten-year time, a chip defective rate will be about 1000 ppm and this can be an issue of reliability.

Reducing defective bits caused by a defect, such as the SICL mode or the like, in a semiconductor memory device will be described below.

A semiconductor memory device according to the present disclosure includes a plurality of memory cells formed on a semiconductor substrate. Each of the memory cells includes a first floating gate transistor, a second floating gate transistor, a first erasing element, a second erasing element, and a memory cell selection transistor. A gate of the first floating gate transistor is electrically coupled to a gate of the first erasing element. A gate of the second floating gate transistor is electrically coupled to a gate of the second erasing element. A source of the first floating gate transistor is electrically coupled to a drain of the memory cell selection transistor. A source of the second floating gate transistor is electrically coupled to the drain of the memory cell selection transistor or a drain of the first floating gate transistor.

According to a semiconductor memory device according to the present disclosure, single storing is performed by a plurality of floating gate transistors provided in each memory cell, and therefore, even when a SILC mode defect occurs in one floating gate transistor, the memory cell as a whole can maintain correct storage, and bit defects can be reduced.

DETAILED DESCRIPTION

Embodiments will be described below with reference to the accompanying drawings. The following description is merely exemplary in nature and is not intended to limit the present teachings thereto. Each of the embodiments can be changed as appropriate in a range in which effects of the present disclosure can be achieved.

First Embodiment

Figure 1:
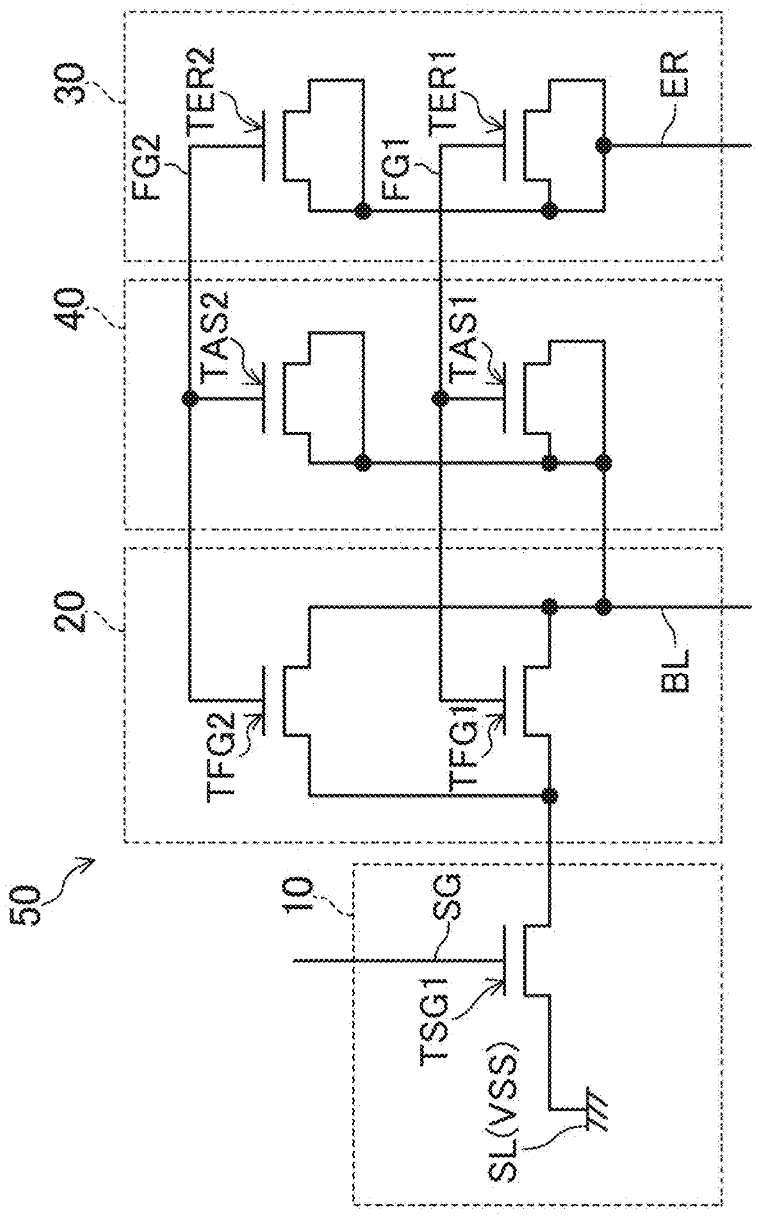
FIG. 1 is a diagram illustrating a circuit configuration of an exemplary semiconductor memory device of a first embodiment.
Figure 2:
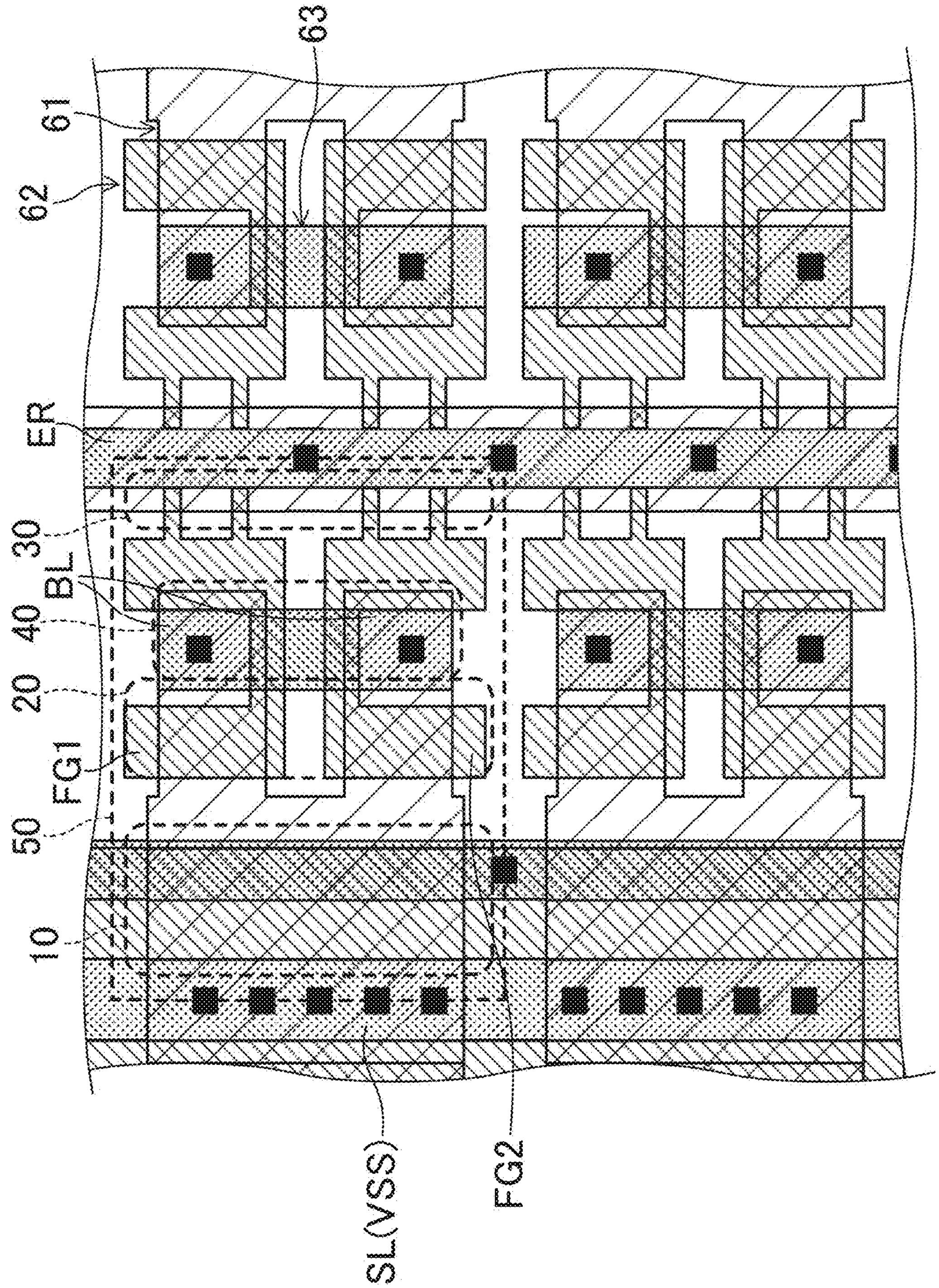
FIG. 2 is a plan view illustrating a layout of the semiconductor memory device of FIG. 1.

A first embodiment of the present disclosure will be described with reference to the accompanying drawings. FIG. 1 is a diagram illustrating a circuit configuration of an exemplary semiconductor memory device of the first embodiment. FIG. 2 is a plan view illustrating a layout of the semiconductor memory device of this embodiment.

With reference to FIG. 1, the circuit configuration will be described. In FIG. 1, a circuit corresponding to one memory cell 50 is illustrated. The memory cell 50 includes a memory cell selection gate portion 10, a program element portion 20, an erasing element portion 30, and an assist element portion 40.

The program element portion 20 has a configuration in which a transistor TFG1 (floating gate transistor) including a first floating gate FG1 as a gate node and a transistor TFG2 including a second floating gate FG2 as a gate node are coupled to each other in parallel. That is, for the transistors TFG1 and TFG2, sources thereof are coupled to each other and drains thereof are coupled to each other.

For the transistors TFG1 and TFG2, a source side is coupled to a drain of a selection transistor TSG1 provided in the selection gate portion 10 and a drain side is coupled to a bit line BL. A source side of the selection transistor TSG1 is coupled to a source signal SL (ground voltage VSS) and a gate of the selection transistor TSG1 is coupled to a selection gate signal SG.

The erasing element portion 30 includes erasing elements TER1 and TER2. The erasing element TER1 includes a first erasing gate and a first erasing element impurity region provided on a semiconductor substrate. The erasing element TER2 includes a second erasing gate and a second erasing element impurity region provided on the semiconductor substrate.

The first floating gate FG1 is coupled to a gate of the erasing element TER1, and the second floating gate FG2 is coupled to a gate of the erasing element TER2. Nodes of the first erasing element impurity region in the erasing element TER1 and the second erasing element impurity region in the erasing element TER2 are coupled to an erasing node ER. The erasing elements TER1 and TER2 are charge controlling elements that control charges in the floating gates FG1 and FG2 and erase information stored in the program element portion 20.

The assist element portion 40 includes assist elements TAS1 and TAS2. The assist element TAS1 includes a first assist gate and a first assist element impurity region provided on the semiconductor substrate. The assist element TAS2 includes a first assist gate and a second assist element impurity region provided on the semiconductor substrate.

The floating gate FG1 is coupled to the assist element TAS1, and the floating gate FG2 is coupled to the assist element TAS2. The assist elements TAS1 and TAS2 are potential controlling elements that control potentials of the floating gates FG1 and FG2 and increase efficiency of a program operation and/or an erasing operation in the program element portion 20.

As for the assist elements TAS1 and TAS2, each of the first assist element impurity region and the second assist element impurity region is coupled as a node to the bit line BL in this embodiment. However, each of the nodes can be controlled by an independent node.

FIG. 2 illustrates a layout corresponding to a circuit diagram of FIG. 1. An active region 61 (indicated oblique lines that extend from upper left to lower right with wide spaces therebetween), various types of gate portions 62 (indicated by oblique lines from upper right to lower left with narrow spaces therebetween), and a metal wiring layer 63 (indicated by dots) are illustrated. The memory cell 50, the memory cell selection gate portion 10, the program element portion 20, the erasing element portion 30, and the assist element portion 40 correspond to those in FIG. 1. For example, the circuit of FIG. 1 can be realized by the layout of FIG. 2.

Next, the program operation, the erasing operation, and a read operation in the semiconductor memory device of this embodiment will be described.

In performing the program operation (writing), the selection transistor TSG1 is turned on and a high voltage is applied to the bit line BL, and thus, hot carriers are generated in the transistors TFG1 and TFG2 that form the program element portion 20. Charges of the hot carriers pass through an insulation film and enter the floating gates FG1 and FG2. As a result, a threshold of the transistors TFG1 and TFG2 is increased, so that a state where a current does not flow therein is caused. Thus, a programmed state is caused.

At this time, since the high voltage is applied to the bit line BL, an action of increasing the potentials of the floating gates FG1 and FG2 work from the assist element portion 40, thus increasing program efficiency.

Also, a voltage at about a level at which the erasing operation is not caused (that is, a lower voltage than that in performing the erasing operation) is applied to the node ER of the erasing elements TER1 and TER2 of the erasing element portion 30. This can also increase the program efficiency.

In performing the erasing operation, the selection transistor TSG1 is turned off, the bit line BL is caused to be at a ground voltage level or in a floating state, and a high voltage is applied to the erasing node ER. Thus, charges stored in the floating gates FG1 and FG2 are pulled. As a result, the threshold voltage of the transistors TFG1 and TFG2 is lowered to cause a state where a current flows. Thus, erasing is completed.

In performing the read operation, the selection transistor TSG1 is turned on and a voltage at about a level at which the program operation is not performed (that is, a lower voltage than that in performing the program operation) is applied. In this state, it is determined based on a current value of a current flowing through the bit line BL whether the memory cell 50 is in an on state or an off state. That is, a determination current value that is a reference for determining whether the memory cell 50 is on or off is set, when the current value of the current flowing through the bit line BL is larger than the determination current value, it is determined that the memory cell 50 is on, and when the current value is smaller than the determination current value, it is determined that the memory cell 50 is off. Note that, in the read operation, the erasing node ER is set to the ground voltage.

For the programmed state and an erased state, verification may be performed by the read operation and an additional program operation and an additional erasing operation may be performed such that a cell current is caused to be a proper current.

—Reduction of Defect of Memory Cell—

Next, it will be described that, in the semiconductor memory device of this embodiment, even in a case where a defect, such as a SILC mode or the like, has occurred, defects of the memory cell 50 as a whole can be reduced.

In a device that stores data based on whether there are charges stored in a floating gates (FG), when the charges stored in the floating gate leak, a proper storage state cannot be held, thus resulting in defective bits. Specifically, a case where charges leak due to a reduced thickness, a defect, or the like of a gate insulation film is called "SILC mode" or the like. There is a probability that a defect due to the SILC mode (which will be also referred to as an "SILC defect") occurs in each floating gate.

In the semiconductor memory device of this embodiment, the program element portion 20 in one memory cell 50 includes the two transistors TFG1 and TFG2 coupled to each other in parallel. One selection transistor TSG1 in the memory cell selection gate portion 10 corresponds to the two transistors. Each of the transistors TFG1 and TFG2 has a corresponding one of the floating gates FG1 and FG2 serving as a gate node separately.

According to this configuration, even when a defect occurs in one of the two floating gates FG1 and FG2, the memory cell 50 can hold correct data. Accordingly, occurrence of a defect can be largely reduced. That is, when it is assumed that a defective rate of a chip when a defect has occurred in one floating gate at a certain probability is about 1000 ppm, a probability at which the SILC defect occurs and the chip becomes defective in the floating gates FG1 and FG2 of the memory cell 50 at the same probability is about 1 ppm.

To allow the memory cell 50 to hold correct data even when the SILC defect occurs in one floating gate, respective current values in the transistors TFG1 and TFG2 and the on and off determination current value in the memory cell 50 are set. This will be further described below.

In Table 1, for each of the transistors TFG1 and TFG2 and the program element portion 20 as a whole, a current value in each of states is indicated. The states are an initial state, a programmed state, a programmed state with a SILC defect, an erased state, and an erased state with a SILC defect. The term "a state with a SILC defect" refers to a state where a SILC defect has occurred in one of the transistors (transistor TFG1). Note that there is no difference in nature even when SILC defect has occurred in the transistor TFG2, not in the transistor TFG1.

TABLE 1

| | Initial State | Programmed State | Programmed State with SILC Defect | Erased State | Erased State with SILC Defect |
|---|---|---|---|---|---|
| TFG1 Current | 3 μA | 0 μA | 3 μA | 15 μA | 3 μA |
| TFG2 Current | 3 μA | 0 μA | 0 μA | 15 μA | 15 μA |
| Overall Current | 6 μA | 0 μA | 3 μA | 30 μA | 18 μA |

In an example of Table 1, when each of the transistors TFG1 and TFG2 is in an initial state, the current value of a current flowing in each of the transistors TFG1 and TFG2 during the read operation is 3 μA. The term "initial state" refers to a state where each element is formed and the floating gates FG1 and FG2 are stabilized (a state where injection of charges or the like is not performed) in steps of manufacturing the semiconductor memory device.

In the program (write) state where a SILC defect has not occurred, each of the current values of the transistors TFG1 and TFG2 is 0 μA. The two transistors TFG1 and TFG2 are coupled to each other in parallel, and therefore, in the programmed state, the current value of the program element portion 20 as a whole (which will be also referred to as an "overall current") is 0 μA.

In the erased state where a SILC defect has not occurred, each of the current values of the transistors TFG1 and TFG2 is 15 μA and the overall current is 30 μA.

In general, when a SILC defect occurs in a transistor and charges leak from a floating gate, a floating gate transistor approaches an initial state. Therefore, in the programmed state with a SILC defect and the erased state with a SILC defect, the current value in the transistor TFG1 in which a defect has occurred is same as that in the initial state, that is, 3 μA.

Based on the foregoing, in the programmed state with a SILC defect, the overall current is a sum of 0 μA and 3 μA, that is, 3 μA. In the erased state with a SILC defect, the overall current is a sum of 15 μA and 3 μA, that is, 18 μA.

In this case, the determination current value that serves as a reference for determining on or off of the memory cell 50 is set to, for example, 5 μA. This is a value between the overall currents (3 μA and 18 μA) in the programmed state with a SILC defect and in the erased state with a SILC defect.

Thus, the overall current in the programmed state where there is no defect is 0 μA and is smaller than the determination current value (5 μA), and therefore, it is determined that the memory cell 50 is in the programmed state. Also in the programmed state with a SILC defect, the overall current is 3 μA and is smaller than the determination current value, and therefore, it can be correctly determined that the memory cell 50 is in the programmed state.

Next, the overall current in the erased state is 30 μA and is larger than the determination current value, and therefore, it is determined the memory cell 50 is in the erased state. Also, in the SILC defect state during the erasing operation, the overall current is 18 μA and is larger than the determination current value, and therefore, it can be correctly determined that the memory cell 50 is in the erased state.

As has been described above, according to the semiconductor memory device of this embodiment, even when the SILC mode defect occurs in the transistor TFG1, the programmed state and the erased state can be correctively determined. Note that, also when the SILC mode detect occurs in the transistor TFG2, instead of the transistor TFG1, the overall current in each state is same as a corresponding value indicated in Table 1 and, similarly, determination can be performed correctly.

The determination current value is a larger value than ½ of the overall current (6 μA) when each of the transistors TFG1 and TFG2 is in the initial state. In the example of Table 1, a larger value than 3 μA is used.

Based on the foregoing, the configuration of this embodiment is suitable for a case where the current value in the initial state is small. This is because, as the current value in the initial state reduces, a lower limit of the determination current value reduces, and thus, a settable range of the determination current value is widened. Although the current value in the initial state is determined due to various factors, the current value can be adjusted by the assist element portion 40. In this embodiment, it can be proper that an effect of the assist element portion 40 is set relatively small. A configuration that does not include the assist element portion 40 may be employed.

The determination current value is preferably a smaller value than ½ of the overall current when each of the transistors TFG1 and TFG2 is in the erased state. In the example of Table 1, a smaller value than 15 μA is used.

The determination current value may be the overall current (6 μA in the example of Table 1) in the initial state. Furthermore, considering that the current of the memory cell 50 during on setting (erasing) reduces at a high temperature and that variation can arise in current in each memory cell 50, the determination current value is preferably a slightly smaller value than the overall current in the initial state, and is 5 μA in the example of this embodiment.

Figure 3:
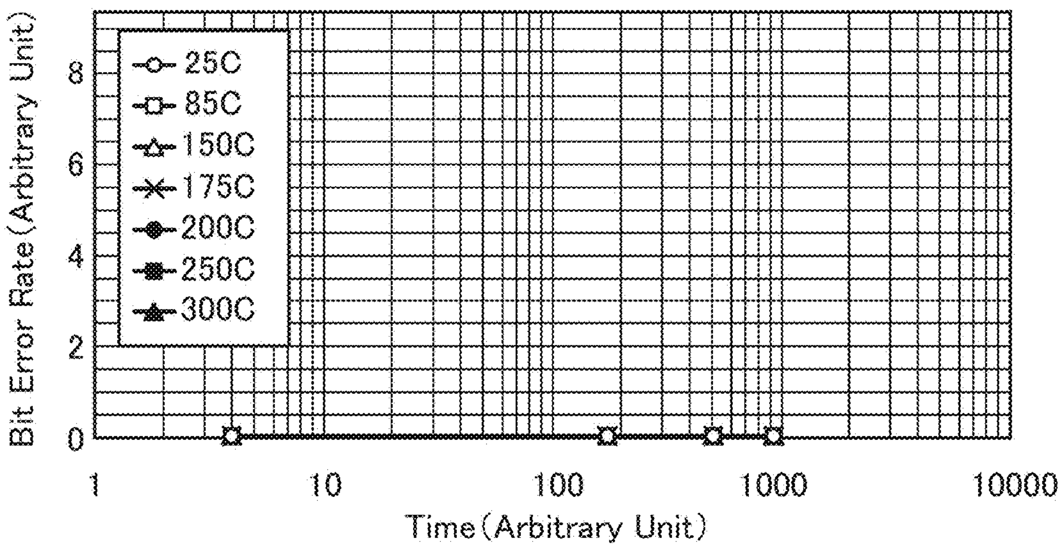
FIG. 3 is a graph illustrating a bit error rate over time in a semiconductor memory device of the first embodiment.

In FIG. 3, for the semiconductor memory device of this embodiment, bit error rates over time under various temperature conditions are illustrated. FIG. 3 is a graph in which an abscissa indicates a time, and an ordinate indicates a bit error rate, and it is understood therefrom that occurrence of defective bits is suppressed even after a time elapsed.

Figure 4:
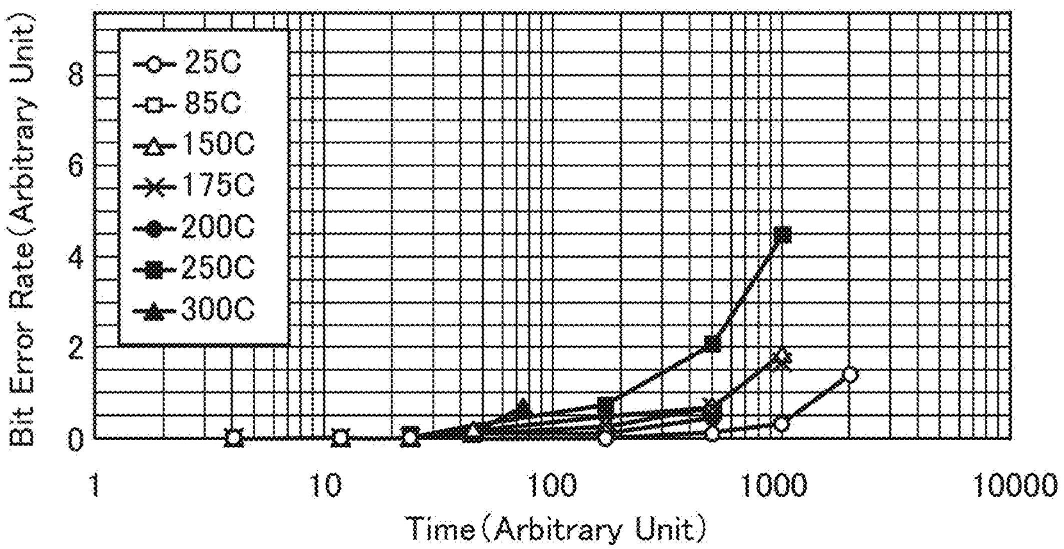
FIG. 4 is a graph illustrating a bit error rate over time in a semiconductor memory device of a comparative example.

In FIG. 4, as a comparative example, for the semiconductor memory device including a known memory cell using a single transistor (including a floating gate as a gate node), similar bit error rates are illustrated. The semiconductor memory device has a configuration similar to the configuration of FIG. 1 but does not include the transistor TFG2, the floating gate FG2, the assist element TAS2, and the erasing element TER2. In this case, the bit error increases over time.

In a case illustrated in FIG. 4, temperature dependency can be seen, and there is a trend that, the higher the temperature is, the more defects are present. However, as for the SILC mode defect, this temperature dependency is small. Therefore, acceleration evaluation at a high temperature and screening are difficult.

According to the semiconductor memory device of the present disclosure, defects can be reduced without an error correction coding (ECC) circuit that copes with the SILC mode defect. However, as a matter off course, for safety in various cases, the semiconductor memory device can include the ECC circuit.

Variation of First Embodiment

Figure 5:
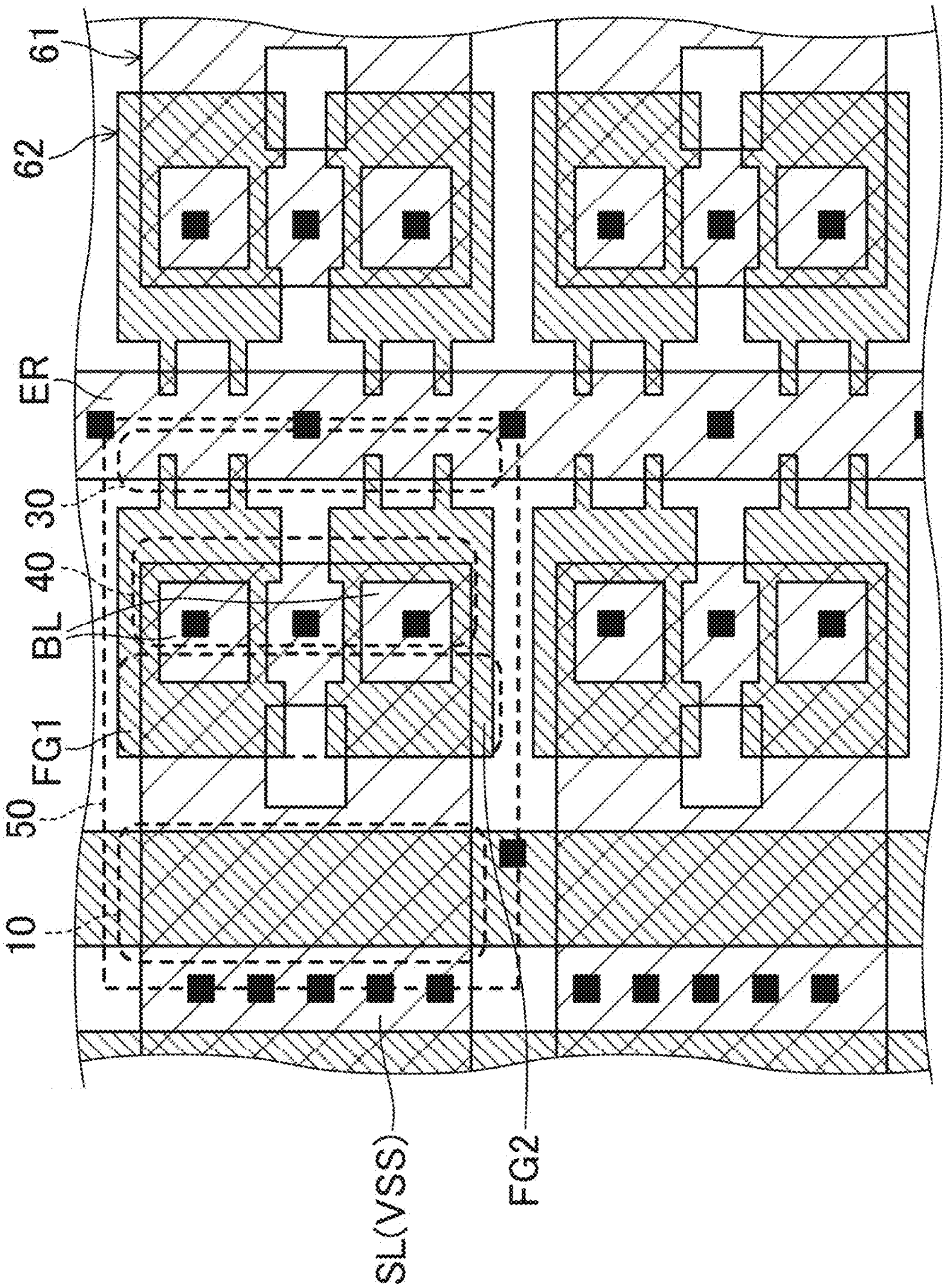
FIG. 5 is a plan view illustrating a layout of a semiconductor memory device of a variation of the first embodiment.

A variation of the first embodiment will be described with reference to FIG. 5. FIG. 5 is a plan view illustrating a layout of a semiconductor memory device in this variation and corresponds to FIG. 2 in the first embodiment. FIG. 5 illustrates a different layout from that of FIG. 2 that realizes the circuit diagram of FIG. 1.

When the layout of FIG. 5 is compared to the layout of FIG. 2, the assist element TAS1 and the assist element TAS2 of the assist element portion 40 are different. That is, an assist effect is increased by forming a gate into a ring shape and arranging the active region 61 in a lower portion of an assist gate.

In the layout of FIG. 2, two bit lines in a same cell are coupled to each other by the metal wiring layer 63, not by the active region 61. In contrast, in the layout of FIG. 5, two bit lines are directly coupled by the active region 61 and an additional active region 61 is also potential-coupled to the bit lines by metal.

In this layout, a capacity between a floating gate and a corresponding bit line can be increased. As a result, a potential of the floating gate can be further increased in performing the program operation. Therefore, the program efficiency can be increased, and furthermore, a program time can be reduced. Moreover, in the erasing operation, an effect of causing the potential of the floating gate to be less likely to float by increasing a capacity of an assist element in the assist element portion 40 can be achieved. Thus, a potential difference between potentials actually applied to the erasing elements TER1 and TER2 can be increased during the erasing operation, and furthermore, an erasing time can be reduced.

As described above, according to the layout of this variation, as compared to the layout of FIG. 2, performance can be increased without increasing a cell size.

Second Embodiment

Figure 6:
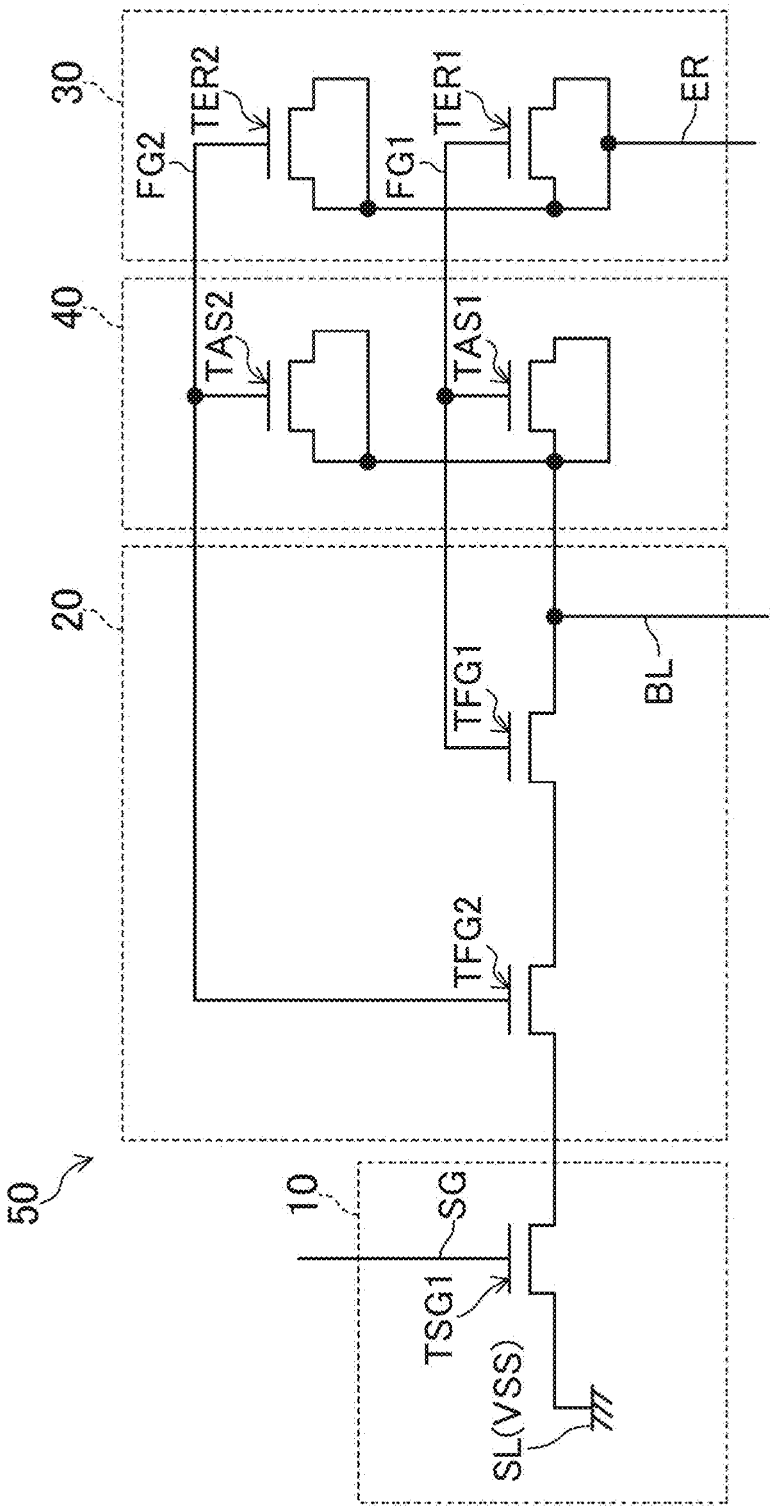
FIG. 6 is a diagram illustrating a circuit configuration of an exemplary semiconductor memory device of a second embodiment.
Figure 7:
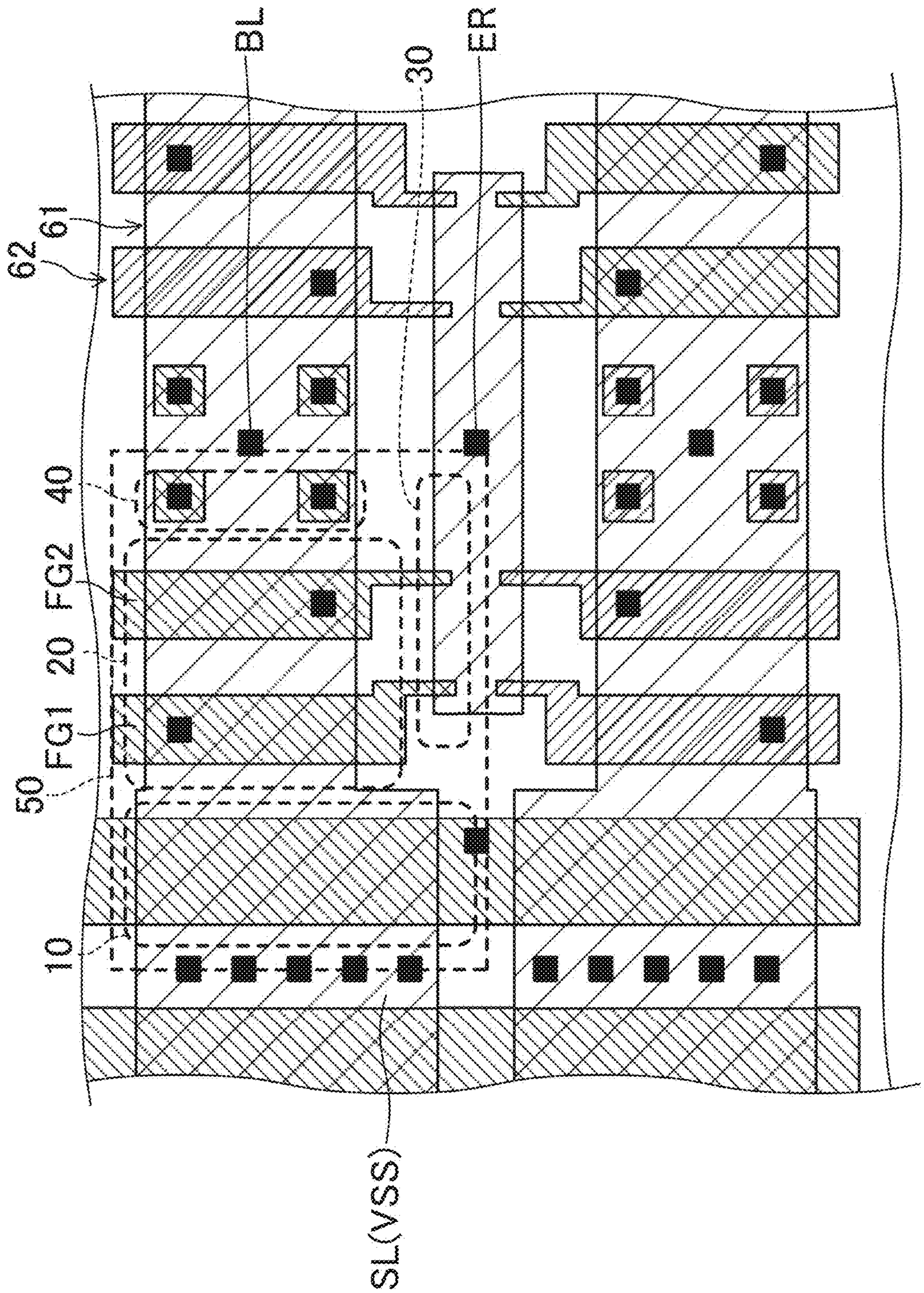
FIG. 7 is a plan view illustrating a layout of the semiconductor memory device of FIG. 6.

A second embodiment of the present disclosure will be described with reference to the accompanying drawings. FIG. 6 is a diagram illustrating a circuit configuration of an exemplary semiconductor memory device of the second embodiment. FIG. 7 is a plan view illustrating a layout of the semiconductor memory device of this embodiment.

When a circuit diagram of FIG. 6 is compared to FIG. 1 that is the circuit diagram of the first embodiment, the program element portion 20 is different from that of the first embodiment, and the memory cell selection gate portion 10, the erasing element portion 30, and the assist element portion 40 are similar to those of the first embodiment. Different points of the second embodiment from the first embodiment will be mainly described below.

In FIG. 2, the transistor TFG1 and the transistor TFG2 are coupled to each other in parallel. In contrast, in this embodiment, the transistors are coupled to each other in series. Specifically, the source of the transistor TFG1 is coupled to the drain of the transistor TFG2. The drain of the transistor TFG1 is coupled to the bit line BL. A source side of the transistor TFG2 is coupled to a drain of the selection transistor TSG1 of the memory cell selection gate portion 10.

The transistors TFG1 and TFG2 include the floating gates FG1 and FG2, respectively, as gate nodes. It is similar to the first embodiment that the erasing element TER1 and the assist element TAS1 are coupled to the floating gate FG1, and the erasing element TER2 and the assist element TAS2 are coupled to the floating gate FG2. As for the assist elements TAS1 and TAS2, each impurity region is coupled as a node to the bit line BL in this embodiment. However, each of the nodes can be controlled by an independent node.

FIG. 7 illustrates a layout corresponding to the circuit diagram of FIG. 6. In FIG. 7, the active region 61 and a gate portion 62 are also illustrated. The memory cell 50, the memory cell selection gate portion 10, the program element portion 20, the erasing element portion 30, and the assist element portion 40 corresponds to those of FIG. 6. For example, the layout of FIG. 6 can realize the circuit of FIG. 5.

Next, a program operation, an erasing operation, and a read operation in the semiconductor memory device of this embodiment will be described.

In performing the program operation, hot carriers are generated in the transistor TFG1 and the transistor TFG2 that form the program element portion 20 by turning the selection transistor TSG1 on and applying a high voltage to the bit line BL. The hot carriers enter the floating gates FG1 and FG2, so that the threshold of the transistors TFG1 and TFG2 are increased and a state where a current does not flow is caused. Thus, the programmed state is caused.

At this time, since the high voltage is applied to the bit line BL, an action of increasing the potentials of the floating gates FG1 and FG2 work from the assist element portion 40, thus increasing the program efficiency.

Also, a voltage at about a level at which the erasing operation is not performed (that is, a lower voltage than that in performing the erasing operation) is applied to the node ER of the erasing elements TER1 and TER2 in the erasing element portion 30. This can also increase the program efficiency.

In performing the erasing operation, the selection transistor TSG1 is turned off, the bit line BL is caused to be at a ground voltage level or in a floating state, and a high voltage is applied to the erasing node ER. Thus, charges stored in the floating gates FG1 and FG2 are pulled. As a result, the threshold voltage of the transistors TFG1 and TFG2 is lowered to cause a state where a current flows. Thus, erasing is completed.

In performing the read operation, the selection transistor TSG1 is turned on and a voltage at about a level at which the program operation is not performed (that is, a lower voltage than that in performing the program operation) is applied to the bit line BL. In this state, it is determined based on a current value of a current flowing through the bit line BL whether the memory cell 50 is in an on state or an off state. That is, a determination current value that is a reference for determining whether the memory cell 50 is on or off is set, when the current value of the current flowing through the bit line BL is larger than the determination current value, it is determined that the memory cell 50 is on, and when the current value is smaller than the determination current value, it is determined that the memory cell 50 is off. Note that, in the read operation, the erasing node ER is set to the ground voltage.

For the programmed state and the erased state, verification may be performed by the read operation and an additional program operation and an additional erasing operation may be performed such that a cell current is caused to be a proper current.

—Reduction of Defect of Memory Cell—

Next, it will be described that, in the semiconductor memory device of this embodiment, even in a case where a defect, such as a SILC mode or the like, has occurred, a defect of the memory cell 50 as a whole can be reduced In the semiconductor memory device of this embodiment, the program element portion 20 in one memory cell 50 includes the two transistors TFG1 and TFG2 coupled to each other in series. One selection transistor TSG1 in the memory cell selection gate portion 10 corresponds to the two transistors. Each of the transistors TFG1 and TFG2 has a corresponding one of the floating gates FG1 and FG2 serving as a gate node separately.

According to this configuration, similar to the first embodiment, occurrence of a defect can be largely reduced. To achieve this, respective current values in the transistors TFG1 and TFG2 and the on and off determination current value in the memory cell 50 are set. This will be further described below.

In Table 2, for each of the transistors TFG1 and TFG2 and the program element portion 20 as a whole, a current value in each of states is indicated. The states are the initial state, the programmed state, the programmed state with a SILC defect, the erased state, and the erased state with a SILC defect. The term "a state with a SILC defect" refers to a state where a SILC defect has occurred in one of the transistors (transistor TFG1).

TABLE 2

| | Initial State | Programmed State | Programmed State with SILC Defect | Erased State | Erased State with SILC Defect |
|---|---|---|---|---|---|
| TFG1 Current | 15 μA | 0 μA | 15 μA | 30 μA | 15 μA |
| TFG2 Current | 15 μA | 0 μA | 0 μA | 30 μA | 30 μA |
| Overall Current | 15 μA | 0 μA | 0 μA | 30 μA | 15 μA |

In an example of Table 2, when each of the transistors TFG1 and TFG2 is in an initial state, the current value of a current flowing in each of the transistors TFG1 and TFG2 during the read operation is 15 μA.

In the program (write) state where a SILC defect has not occurred, each of the current values of the transistors TFG1 and TFG2 is 0 μA. The two transistors TFG1 and TFG2 are coupled to each other in series, and therefore, in the programmed state, the current value of the program element portion 20 as a whole (overall current) is 0 μA.

In the erased state where a SILC defect has not occurred, each of the current values of the transistors TFG1 and TFG2 that are coupled in series is 30 μA and the overall current is 30 μA.

In the programmed state with a SILC defect and in the erased state with a SILC defect, the current value in the transistor TFG1 in which a defect has occurred is 15 μA that is a same current value as that in the initial state.

Based on the foregoing, in the programmed state with a SILC defect, the current values of the transistors TFG1 and TFG2 that are coupled in series are 15 μA and 0 μA, respectively, and therefore, the overall current is 0 μA. In the erased state with a SILC defect, the current values of the transistors TFG1 and TFG2 that are coupled in series are 15 μA and 30 μA, respectively, and therefore, the overall current is 15 μA.

In this case, the determination current value is set to, for example, 12 μA. This is a value between the overall currents (15 μA and 0 μA) in the programmed state with a SILC defect and in the erased state with a SILC defect.

Thus, each in the programmed state and in the programmed state with a SILC defect, the overall current is 0 μA and is smaller than 12 μA that is the determination current value, and therefore, it is correctly determined that the memory cell 50 is in the programmed state.

The overall current in the erased state where there is no defect is 30 μA and is larger than the determination current value, and therefore, it is determined that the memory cell 50 is in the erased state. Furthermore, also in the SILC defect state during the erasing operation, the overall current is 15 μA and is larger than the determination current value, and therefore, it is correctly determined that the memory cell 50 is in the erased state.

As has been described above, according to the semiconductor memory device of this embodiment, even when the SILC mode defect occurs in the transistor TFG1, the programmed state and the erased state can be correctively determined. Note that, also, when the SILC mode detect occurs in the transistor TFG2, instead of the transistor TFG1, the overall current in each state is same as a corresponding value indicated in Table 2 and, similarly, determination can be performed correctly.

The determination current value is a smaller value than an overall current value of the overall current that flows when each of the transistors TFG1 and TFG2 is in the initial state.

The configuration of this embodiment is suitable for a case where the current value in the initial state is large and a SILC mode defect at an on side is less likely to occur. Although the current value in the initial state is determined due to various factors, the current value can be adjusted by the assist element portion 40. In this embodiment, it can be proper to set an effect of the assist element portion 40 relatively large. Moreover, it can be proper that, for the assist element portion 40, a configuration in which control is performed using, instead of a signal from the bit line BL, some other signal is employed and the assist effect is increased. However, the effect of the assist element portion 40 is caused to be in a range in which the memory cell 50 is not put in the programmed state during the read operation.

Third Embodiment

Figure 8:
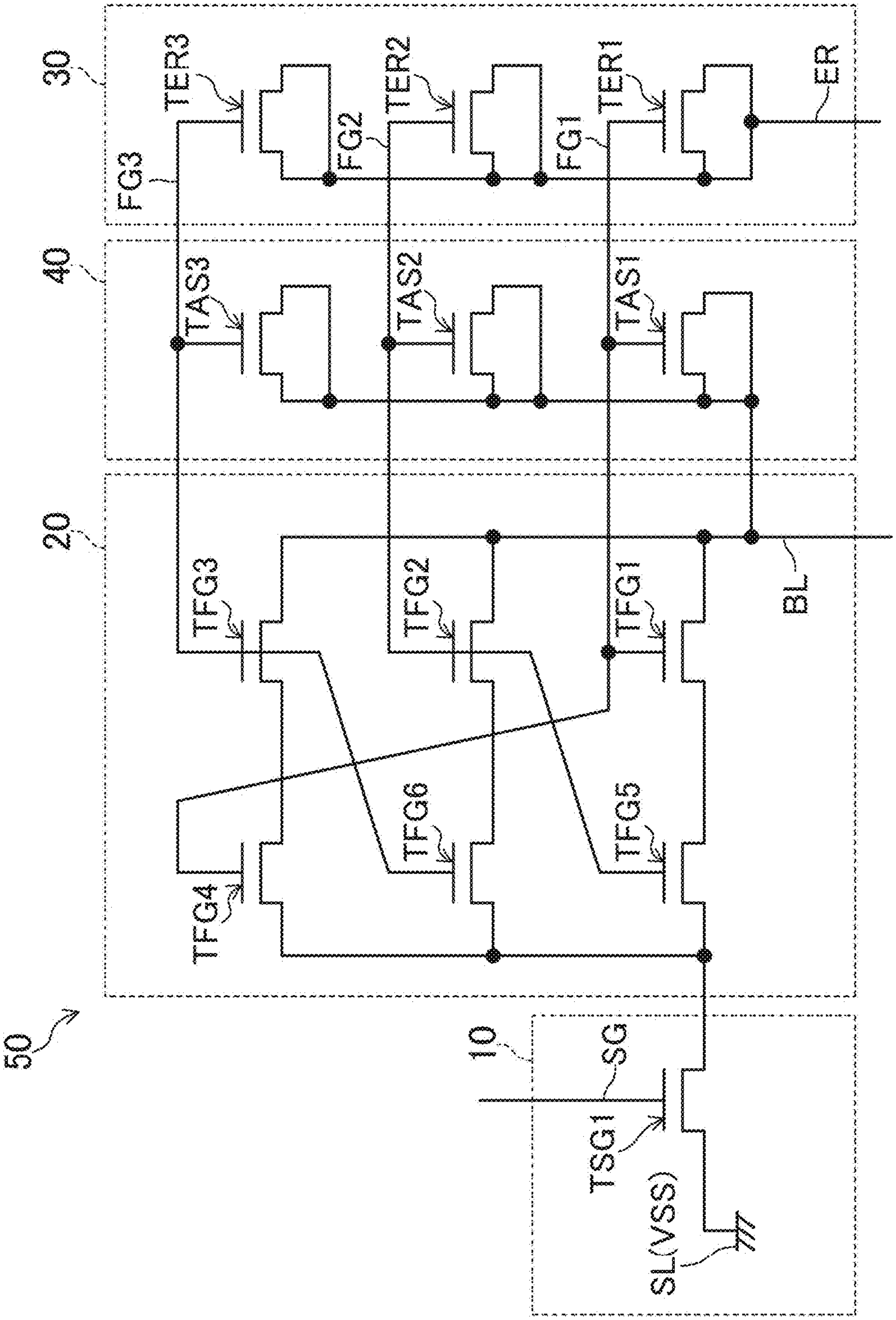
FIG. 8 is a diagram illustrating a circuit configuration of an exemplary semiconductor memory device of a third embodiment.
Figure 9:
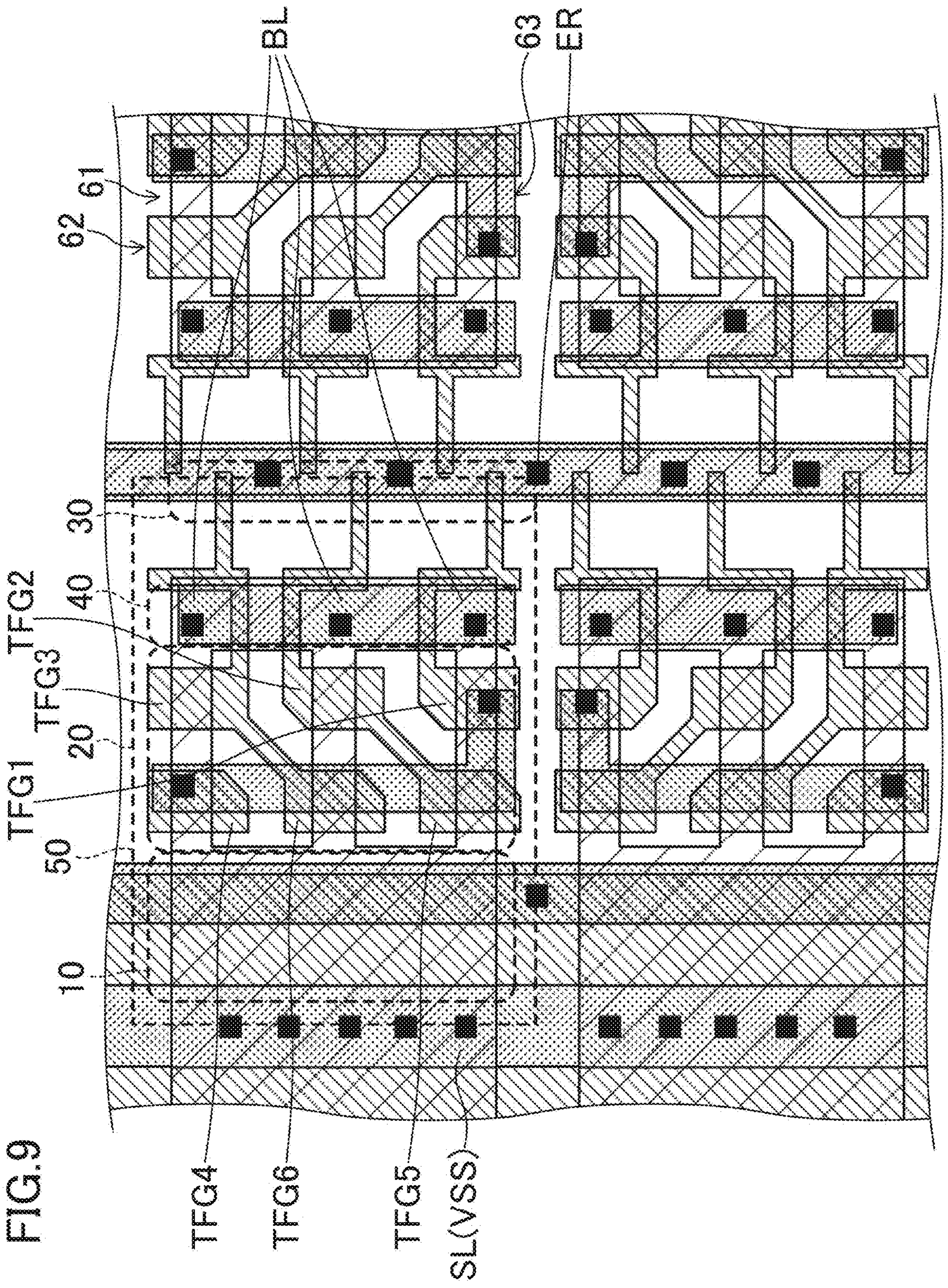
FIG. 9 is a plan view illustrating a layout of the semiconductor memory device of FIG. 8.

A third embodiment of the present disclosure will be described with reference to the accompanying drawings. FIG. 8 is a diagram illustrating a circuit configuration of an exemplary semiconductor memory device of the third embodiment. FIG. 9 is a plan view illustrating a layout of the semiconductor memory device of this embodiment.

When the circuit diagram of FIG. 8 is compared to FIG. 1 that is a circuit diagram of the first embodiment, the circuit diagram of FIG. 8 is similar to the circuit diagram of FIG. 1 in that the memory cell 50 includes the memory cell selection gate portion 10, the program element portion 20, the erasing element portion 30, and the assist element portion 40. The memory cell selection gate portions 10 in both the circuit diagrams have a same configuration.

The program element portion 20 includes six transistors TFG1 to TFG6. A source of the transistor TFG1 is coupled to a drain of the transistor TFG5. A source of the transistor TFG2 is coupled to a drain of the transistor TFG6. A source of the transistor TFG3 is coupled to a drain of the transistor TFG4.

Pairs of two transistors that are coupled to each other in series in the manner described above are coupled to each other in parallel to form the program element portion 20. That is, respective sources of the transistor TFG4, the transistor TFG6, and the transistor TFG5 are coupled to each other and are coupled to the drain of the selection transistor TSG1. Drains of the transistors TFG3, TFG2, and TFG1 are coupled to each other and are coupled to the bit line BL.

The assist element portion 40 includes three assist elements TAS1, TAS2, and TAS3. The assist element TAS3 has a similar configuration to those of the assist elements TAS1 and TAS2 and includes a third assist gate and a third assist element impurity region.

Each of the impurity regions in the assist elements TAS1, TAS2, and TAS3 is coupled as a node to the bit line BL in this embodiment. However, each of the nodes can be controlled by an independent node.

The erasing element portion 30 includes three erasing elements TER1, TER2, and TER3. The erasing element TER3 has a similar configuration to those of the erasing elements TER1 and TER2 and includes a third erasing gate and a third erasing portion impurity region.

Each of the impurity regions in the erasing elements TER1, TER2, and TER3 is coupled as a node to the erasing node ER.

Moreover, three floating gates FG1, FG2, and FG3 are provided.

Gates of the transistors TFG1 and TFG4, the erasing element TER3, and the assist element TAS3 are coupled to the floating gate FG1.

Gates of the transistors TFG2 and TFG5, the erasing element TER2, and the assist element TAS2 are coupled to the floating gate FG2.

Gates of the transistors TFG3 and TFG6, the erasing element TER3, and the assist element TAS3 are coupled to the floating gate FG3.

FIG. 9 illustrates a layout corresponding to the circuit diagram of FIG. 8. Also in FIG. 9, the active region 61, the gate portion 62, and the metal wiring layer 63 are illustrated. The memory cell 50, the memory cell selection gate portion 10, the program element portion 20, the erasing element portion 30, and the assist element portion 40 correspond to those in FIG. 8. For example, the circuit of FIG. 8 can be realized by the layout of FIG. 9.

Next, a program operation, an erasing operation, and a read operation in the semiconductor memory device of this embodiment will be described.

In performing the program operation, the selection transistor TSG1 is turned on and a high voltage is applied to the bit line BL, and thus, hot carriers are generated in each of the transistors TFG1 to TFG6 that form the program element portion 20. The hot carriers enter the floating gates FG1 and FG2, so that the threshold of the transistors TFG1 to TFG6 are increased and a state where a current does not flow is caused. Thus, the programmed state is caused.

At this time, since the high voltage is applied to the bit line BL, an action of increasing potentials of the floating gates FG1 to FG3 work from the assist element portion 40, thus increasing the program efficiency.

In performing the erasing operation, the selection transistor TSG1 is turned off and the bit line BL is caused to be at the ground level or in a floating state, and a high voltage is applied to the erasing node ER. Thus, charges stored in the floating gates FG1 to FG3 are pulled. As a result, a threshold voltage of the transistors TFG1 to TFG6 is lowered to cause a state where a current flows. Thus, erasing is completed.

In performing the read operation, the selection transistor TSG1 is turned on and a voltage at about a level at which the program operation is not performed (that is, a lower voltage than that in performing the program operation) is applied to the bit line BL. In this state, it is determined based on a current value of a current flowing through the bit line BL whether the memory cell 50 is in an on state or an off state. In the read operation, the erasing node ER is set to the ground voltage.

For the programmed state and the erased state, verification may be performed by the read operation and an additional program operation and an additional erasing operation may be performed such that a cell current is caused to be a proper current.

—Reduction of Defect of Memory Cell—

Next, it will be described that, in the semiconductor memory device of this embodiment, even in a case where a defect, such as a SILC mode or the like, has occurred, a defect of the memory cell 50 as a whole can be reduced In the semiconductor memory device of this embodiment, the program element portion 20 in one memory cell 50 includes the six transistors TFG1 to TFG6 coupled to each other in the manner described above, and one selection transistor TSG1 in the memory cell selection gate portion 10 corresponds to the transistors TFG1 to TFG6.

According to this configuration, even when a defect occurs in any one of the floating gates FG1 to FG3, occurrence of defective bits can be largely reduced. To achieve this, respective current values in the transistors TFG1 to TFG6 and the on and off determination current value in the memory cell 50 are set. This will be further described below.

In Table 3, for each of the three pairs of the transistors coupled in series, that is, the transistors TFG1 and TFG4, the transistors TFG2 and TFG5, and the transistors TFG3 and TFG6, and the program element portion 20 as a whole, a current value in each of states is indicated. The states are the initial state, the programmed state, the programmed state with a SILC defect, the erased state, and the erased state with a SILC defect. The term "a state with a SILC defect" refers to a state where a state with a SILC defect has occurred in the floating gate FG1 (in other words, either one of the transistors TFG1 and TFG4).

Note that the current values in the two transistors coupled in series are simplified values and are not necessarily accurate. This is because, using the simplified values, it is possible to make the following description clearer and more concise than when using accurate values and, even using the simplified values, description of configuration and effects of the device are not affected much.

TABLE 3

| | Initial State | Programmed State | Programmed State with SILC Defect | Erased State | Erased State with SILC Defect |
|---|---|---|---|---|---|
| TFG1/TFG4 Current | 3 μA | 0 μA | 3 μA | 10 μA | 3 μA |
| TFG2/TFG5 Current | 3 μA | 0 μA | 0 μA | 10 μA | 10 μA |
| TFG3/TFG6 Current | 3 μA | 0 μA | 0 μA | 10 μA | 10 μA |
| Overall Current | 9 μA | 0 μA | 0 μA | 30 μA | 16 μA |

In an example of Table 3, each of the current values of the transistors TFG1 to TFG6 in the initial state is 3 μA. Therefore, the overall current (the current value of the program element portion 20 as a whole) is a sum of currents in the three pairs of transistors coupled in parallel, that is, 9 μA.

Also in this embodiment, when a SILC defect occurs in a transistor and charges leak from a floating gate, a floating gate transistor approaches an initial state (current value 3 μA).

In the programmed state where a SILC defect has not occurred, each of the current values of the transistors TFG1 to TFG6 is 0 μA. Therefore, the overall current is 0 μA.

In the programmed state with a SILC defect, the threshold fluctuates in the transistors TFG1 and TFG4 coupled to the floating gate FG1 and a state where a current of 3 μA can flow in each of the transistors TFG1 and TFG4 is caused. However, the transistor TFG5 is coupled to the transistor TFG1 in series and the transistor TFG4 is coupled to the transistor TFG3 in series, and therefore, each of currents of these pairs is 0 μA. Accordingly, in the programmed state with a SILC defect, the overall current is 0 μA. Therefore, the memory cell 50 as a whole is not defective.

In the erased state where a SILC defect has not occurred, each of the current values of the transistors TFG1 to TFG6 is 10 μA. Therefore, the overall current is 30 μA.

In the erased state with a SILC defect, the threshold fluctuates in the transistors TFG1 and TFG4 coupled to the floating gate FG1 and the current flowing in each of the transistors TFG1 and TFG4 changes from 10 μA (the current value during the erasing operation) to 3 μA.

In this case, in two pairs including the transistor TFG1 or TFG4 of the three pairs of transistors coupled in series, the current value is 3 μA. In the transistors TFG2 and TFG3 that are the other pairs, 10 μA is maintained. The three pairs are coupled to each other in parallel, and therefore, the overall current is 16 μA that is a sum of the current values.

In this case, assuming that the determination current value is a value between 0 μA to 16 μA, for example, 5 μA, even when a SILC defect occurs in some of the floating gats, it can be determined that the memory cell 50 is in the erased state, and the memory cell 50 as a whole is not defective.

The determination current value is set to be in a range that is smaller than the overall current in the erased state with a SILC defect and is larger than the overall current in the programmed state.

According to the configuration of this embodiment, regardless of the current value in the initial state, a defective as a memory cell can be reduced and on and off can be reliably determined. Note that a case where the SILC mode defect has occurred in the floating gate FG1 has been described above as an example. However, for a case where the SILC mode defect has occurred in a different one of the floating gates (FG2 or FG3), the overall current in each of the states is same as a corresponding one of the values indicated in Table 3, and correct determination can be performed in a similar manner.

The first embodiment mainly cope with an influence of a defect at the on side, and the second embodiment mainly cope with an influence of a defect at the off side. In contrast, this embodiment can cope with both an influence of a defect at the on side and an influence of a defect at the off side.

On the other hand, in the configurations of the first embodiment and the second embodiment, a smaller number of transistors, a smaller number of erasing elements, and a smaller number of assist elements are provided in the program element portion 20, the erasing element portion 30, and the assist element portion 40, respectively, than in the configuration of the third embodiment. Therefore, in the first embodiment or the second embodiment, the memory cell 50 can be made smaller in size, or a cell current can be increased in the memory cell 50 in a same size.

Note that a case where various elements are formed in a same well using N-channel-type transistors for all the elements has been described. However, the present disclosure is not limited thereto, and the elements can be formed using P-channel-type transistors.

As the third embodiment, the configuration in which three pairs of transistors coupled in series are coupled to each other in parallel (2×3 configuration) has been described, but the present disclosure is not limited thereto. A 3×2 configuration, a 3×4 configuration, or the like may be employed.

For the embodiments described above, changes and modifications may be made without departing from the scope of the claims. Contents of the embodiments can be combined and replaced as appropriate unless a function of a target of the present disclosure is ruined.

A semiconductor memory device according to the present disclosure can largely reduce occurrence of a defect, such as a SILC mode or the like, and is useful as a semiconductor memory device on which a nonvolatile memory is mounted.

What is claimed is:

1. A semiconductor memory device comprising:

a plurality of memory cells formed on a semiconductor substrate, wherein each of the memory cells includes a first floating gate transistor, a second floating gate transistor, a first erasing element, a second erasing element, and a memory cell selection transistor, a gate of the first floating gate transistor is electrically coupled to a gate of the first erasing element, a gate of the second floating gate transistor is electrically coupled to a gate of the second erasing element, a source of the first floating gate transistor is electrically coupled to a drain of the memory cell selection transistor, and a source of the second floating gate transistor is electrically coupled to the drain of the memory cell selection transistor or a drain of the first floating gate transistor.

2. The semiconductor memory device according to claim 1, wherein each of the memory cells includes a first assist element that controls a gate potential of the first floating gate transistor, and a second assist element that controls a gate potential of the second floating gate transistor.

3. The semiconductor memory device according to claim 1, wherein the source of the first floating gate transistor and the source of the second floating gate transistor are electrically coupled to each other, the drain of the first floating gate transistor and a drain of the second floating gate transistor are electrically coupled to each other, and the source of the second floating gate transistor is electrically coupled to the memory cell selection transistor.

4. The semiconductor memory device according to claim 3, wherein the first erasing element includes a first erasing gate and a first impurity region formed on the semiconductor substrate, the second erasing element includes a second erasing gate and a second impurity region formed on the semiconductor substrate, and the first impurity region and the second impurity region are electrically coupled to each other.

5. The semiconductor memory device according to claim 1, wherein the source of the first floating gate transistor and a drain of the second floating gate transistor are electrically coupled to each other, and the source of the floating gate transistor is electrically coupled to the drain of the memory cell selection transistor.

6. The semiconductor memory device according to claim 5, wherein the first erasing element includes a first erasing gate and a first impurity region formed on the semiconductor substrate, the second erasing element includes a second erasing gate and a second impurity region formed on the semiconductor substrate, and the first impurity region and the second impurity region are electrically coupled to each other.

7. The semiconductor memory device according to claim 1, wherein each of the plurality of memory cells further includes a third floating gate transistor, a fourth floating gate transistor, a fifth floating gate transistor, a sixth floating gate transistor, and a third erasing element, a gate of the third floating gate transistor is electrically coupled to a gate of the third erasing element, a gate of the fourth floating gate transistor is electrically coupled to the gate of the first erasing element, a gate of the fifth floating gate transistor is electrically coupled to the gate of the second erasing element, a gate of the sixth floating gate transistor is electrically coupled to the gate of the third erasing element, the source of the first floating gate transistor is electrically coupled to a drain of the fifth floating gate transistor, instead of the drain of the memory sell selection transistor, the source of the second floating gate transistor is electrically coupled to a drain of the sixth floating gate transistor, instead of the drain of the memory cell selection transistor or the drain of the first floating gate transistor, a source of the third floating gate transistor is electrically coupled to a drain of the fourth floating gate transistor, the drain of the first floating gate transistor, a drain of second floating gate transistor, and a drain of the third floating gate transistor are electrically coupled to each other, and a source of the fourth floating gate transistor, a source of the fifth floating gate transistor, and a source of the sixth floating gate transistor are electrically coupled to the drain of the memory cell selection transistor.

8. The semiconductor memory device according to claim 7, wherein the first erasing element includes a first erasing gate and a first impurity region formed on the semiconductor substrate, the second erasing element includes a second erasing gate and a second impurity region formed on the semiconductor substrate, the third erasing element includes a third erasing gate and a third impurity region formed on the semiconductor substrate, and the first impurity region, the second impurity region, and the third impurity region are electrically coupled to each other.

9. The semiconductor memory device according to claim 3, wherein a determination current value used for determining whether the memory cell is in an on state or an off state exceeds ½ of an overall current value when each of the first floating gate transistor and the second floating gate transistor is in an initial state.

10. The semiconductor memory device according to claim 3, wherein a determination current value used for determining whether the memory cell is in an on state or an off state is less than ½ of an overall current value when each of the first floating gate transistor and the second floating gate transistor is in an erased state.

11. The semiconductor memory device according to claim 5, wherein a determination current value used for determining whether the memory cell is in an on state or an off state is smaller than an overall current value when each of the first floating gate transistor and the second floating gate transistor is in an initial state.

12. The semiconductor memory device according to claim 5, wherein a determination current value used for determining whether the memory cell is in an on state or an off state is larger than an overall current value when each of the first floating gate transistor and the second floating gate transistor is in a programmed state.

* * * * *